United States Patent
Katou (10) Patent No.: US 8,445,987 B2
(45) Date of Patent: May 21, 2013

(54) SEMICONDUCTOR DEVICE HAVING A LOWER-LAYER LINE

(75) Inventor: Tetsuya Katou, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 606 days.

(21) Appl. No.: 12/385,839

(22) Filed: Apr. 21, 2009

(65) Prior Publication Data

US 2009/0295463 A1 Dec. 3, 2009

(30) Foreign Application Priority Data

May 27, 2008 (JP) .................................. 2008-137844

(51) Int. Cl.
*H01L 21/70* (2006.01)

(52) U.S. Cl.
USPC .......................................... 257/499; 327/534

(58) Field of Classification Search
USPC .......................................... 257/499; 327/534
See application file for complete search history.

(56) References Cited

U.S. PATENT DOCUMENTS

2007/0074134 A1* 3/2007 Katoh ................................ 716/1
2008/0246108 A1* 10/2008 Sakurabayashi .............. 257/503

FOREIGN PATENT DOCUMENTS

JP 2007-95787 4/2007

* cited by examiner

*Primary Examiner* — Shaun Campbell
(74) *Attorney, Agent, or Firm* — McGinn IP Law Group, PLLC (57) ABSTRACT

A semiconductor device includes a semiconductor substrate, a first lower-layer line for supplying power to a transistor formed on the semiconductor substrate, a first interlayer line which is connected to the first lower-layer line, and an allowable current of which is larger than that of the first lower-layer line; and an upper-layer line which is provided above the first interlayer line and receives power input from outside. The first interlayer line is connected to the upper-layer line through a switch circuit formed on the semiconductor substrate.

20 Claims, 9 Drawing Sheets

SEMICONDUCTOR DEVICE HAVING A LOWER-LAYER LINE

BACKGROUND

1. Field of the Invention

The present invention relates to a semiconductor device, and particularly, to a semiconductor device including a circuit in which power supply is controlled by a switch circuit.

2. Description of Related Art

In recent years, in semiconductor devices, miniaturization of semiconductor elements such as transistors is in progress in order to realize high integration. However, because of the miniaturization of a transistor, a leak current in a transistor has significantly increased. In view of this, a switch circuit (e.g., switch transistor) is provided between a power source line and a transistor that forms a circuit, thereby reducing a leak current caused when the circuit is stopped. Such a method of controlling power is disclosed in Japanese Unexamined Patent Application Publication No. 2007-95787.

Japanese Unexamined Patent Application Publication No. 2007-95787 discloses a technique in which a switch transistor is provided between a lower-layer line connected to a circuit as a power control target and an upper-layer line that receives power supply from outside. In a case of stopping the circuit, a switch transistor is caused to be in an off state to bring the lower-layer line and the upper-layer line into a shutdown state, thereby reducing a leak current that flows into a transistor forming a circuit.

SUMMARY

The present inventor found a problem that a switch transistor is required to be provided for each lower-layer line in a case where a plurality of lower-layer lines are provided in Japanese Unexamined Patent Application Publication No. 2007-95787. Further, generally, in a case where a large amount of current is caused to flow through the lower-layer line, there is a fear that electromigration occurs and therefore a connection failure of the line may occur. Accordingly, in Japanese Unexamined Patent Application Publication No. 2007-95787, the switch transistors cannot be arranged at large intervals. That is, in the method disclosed in Japanese Unexamined Patent Application Publication No. 2007-95787, the switch transistors are required to be arranged at small intervals for each lower-layer line. Thus, in Japanese Unexamined Patent Application Publication No. 2007-95787, the circuit has to be placed in a small area between the switch transistors, which raises a problem of reducing degrees of freedom of a circuit layout.

The semiconductor device according to the present invention can improve the degrees of freedom of the layout of the circuit elements to which electric power is supplied through the switch transistors.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
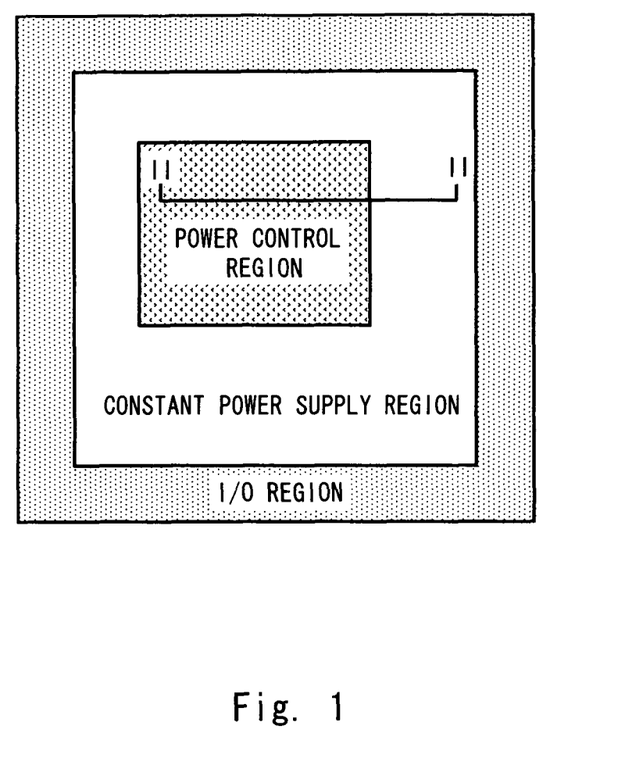
FIG. 1 is a schematic diagram showing a semiconductor device according to a first exemplary embodiment of the present invention.

Hereinafter, exemplary embodiments of the present invention will be described with reference to the drawings. FIG. 1 is a schematic diagram showing a semiconductor device according to this exemplary embodiment. As shown in FIG. 1, the semiconductor device according to this exemplary embodiment includes an I/O region, a first region (e.g., power control region), and a second region (e.g., constant power supply region).

The I/O region is a region where an external interface circuit in the semiconductor device is disposed. The external interface circuit has, for example, an input/output circuit and pads. In each of the power control region and the constant power supply region, a functional circuit for implementing various functions which is packaged in the semiconductor device is disposed. In this exemplary embodiment, the functional circuit is structured by combining cells (hereinafter, referred to as standard cells) implementing a minimal function of the circuit.

The power control region also includes a switch circuit (hereinafter, referred to as switch cell). To the standard cells disposed in the power control region, electric power is supplied through the switch cell. That is, when the switch cell is in an on state, the standard cell disposed in the power control region receives a power supply and becomes an operable state. Meanwhile, when the switch cell is in an off state, the power supply is shut down and therefore the standard cell becomes a stopped state.

On the other hand, to the standard cell disposed in the constant power supply region, electric power is directly supplied from outside without involving the switch cell. That is, to the standard cell disposed in the constant power supply region, electric power is constantly supplied during when the electric power is supplied to the semiconductor device from outside.

Figure 2:
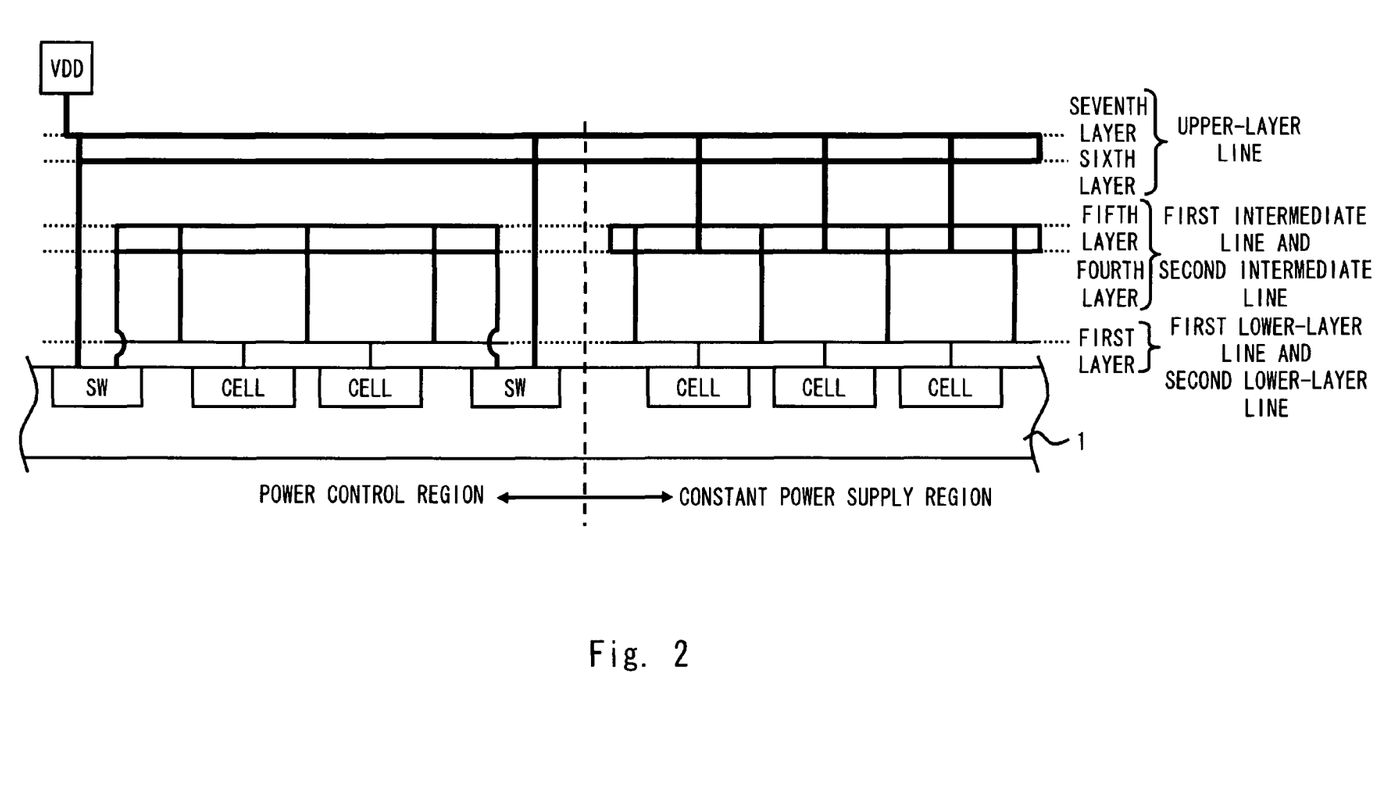
FIG. 2 is a schematic cross-sectional diagram showing the semiconductor device taken along the line II-II of FIG. 1.

Here, FIG. 2 is a schematic cross-sectional diagram showing the semiconductor device taken along the line II-II of FIG. 1. As shown in FIG. 2, the semiconductor device includes a semiconductor substrate 1 and a plurality of line layers provided above the semiconductor substrate 1. In an example shown in FIG. 2, seven line layers are provided, but the number of layers can be arbitrarily set to carry out the present invention.

In a region corresponding to the constant power supply region in the semiconductor substrate 1, transistors constituting the standard cells (simply represented as cell in FIG. 2) provided in the semiconductor device are formed, while in a region corresponding to the power control region, the standard cells and switch cells SW are formed.

Further, lines provided in a seventh line layer and a sixth line layer (hereinafter, referred to as upper-layer line) out of the line layers are formed over the entire circuit formation region (region including the power control region and the constant power supply region) of the semiconductor device. The upper-layer lines are connected to a power supply pad provided in the I/O region and receive power supply from outside. Lines provided in a fifth line layer and a fourth line layer out of the line layers are separately provided in the power control region and the constant power supply region. Out of the lines provided in the fifth line layer and the fourth line layer, lines provided in the power control region are referred to as first interlayer lines, hereinafter. Also, out of the lines provided in the fifth line layer and the fourth line layer, lines provided in the constant power supply region are referred to as second interlayer lines, hereinafter. Lines provided in a first line layer out of the line layers are separately formed in the power control region and the constant power supply region. Out of the lines formed in the first line layer, a line provided in the power control region is referred to as a first lower-layer line, hereinafter. Also, out of the lines formed in the first line layer, a line provided in the constant power supply region is referred to as a second lower-layer line, hereinafter.

The first and second lower-layer lines are disposed together with the standard cell by an automatic placement and routing in a layout process of the semiconductor device, for example. Its line width is determined mainly in accordance with the minimum line width that is allowable in a manufacturing process. In addition, the thickness of the first and second lower-layer lines is set thinner than that of each of the first and second interlayer lines and the upper-layer line. Therefore, the first and second lower-layer lines each have an amount of allowable current smaller than that of each of the first and second interlayer lines and the upper-layer line.

In the semiconductor device according to this exemplary embodiment, the first interlayer line is connected to the upper-layer line through the switch cell SW. Meanwhile, the second interlayer line is connected to the upper-layer line without involving the switch cell SW. Further, the second interlayer line and the upper-layer line are connected by a via line, and the second interlayer line and the lower-layer line are also connected by the via line. The second lower-layer line is connected to the standard cell by a contact line. The first interlayer line and the first lower-layer line are connected by the via line. The first lower-layer line is connected to the standard cell by the contact line. The upper-layer line and the switch cell SW, and the first interlayer line and the switch cell SW are respectively connected by a through-via line formed by penetrating the plurality of line layers. It should be noted that the electrically connections between the upper-layer line and the switch cell SW and between the first interlayer line and the switch cell SW may be formed through the via lines and a relay lines by connecting the via lines formed between the respective line layers being by the relay lines.

Figure 3:
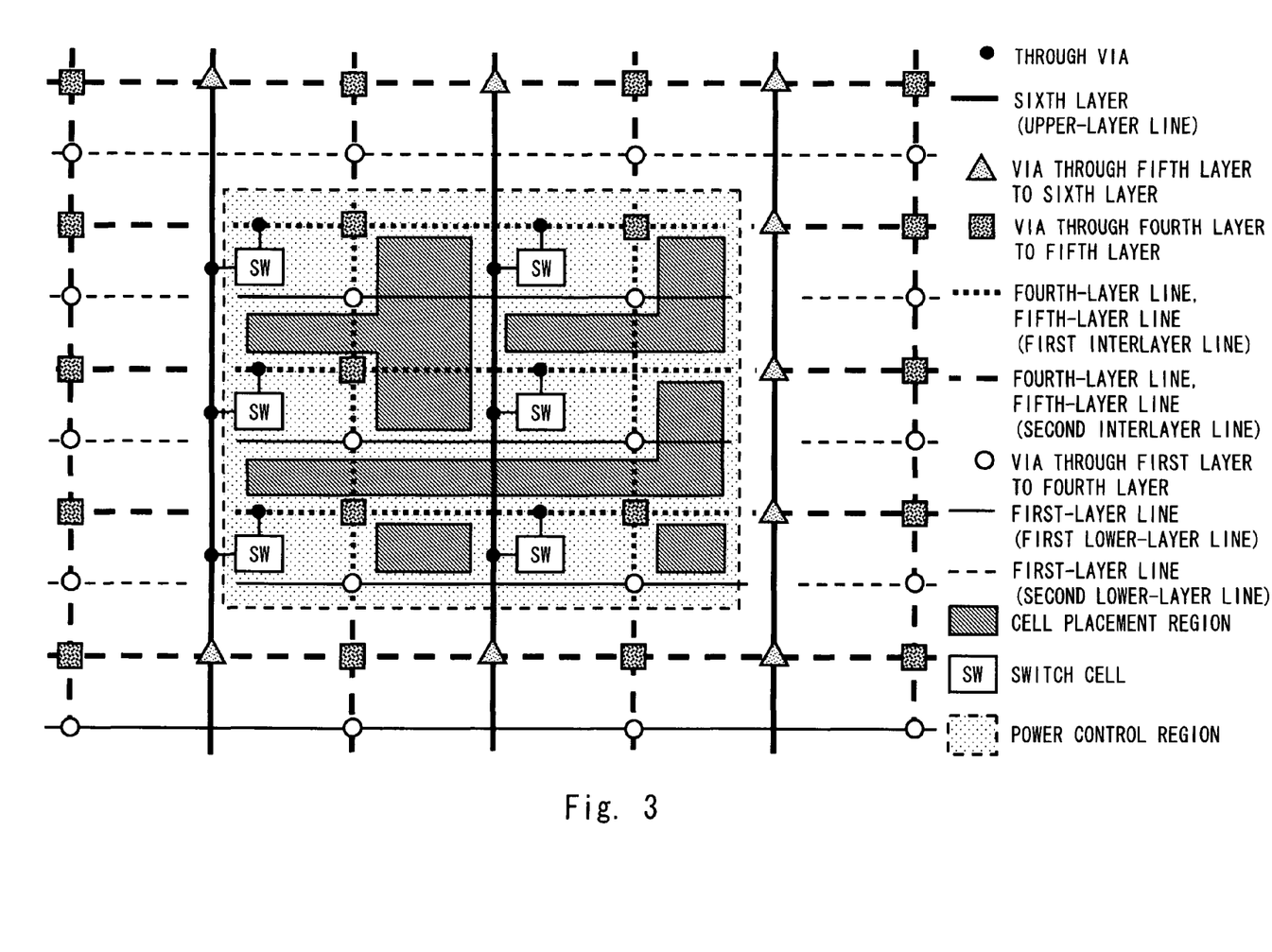
FIG. 3 is a schematic diagram showing a layout of the semiconductor device according to the first exemplary embodiment.

Subsequently, FIG. 3 is a schematic diagram showing a layout of the power control region and the constant power supply region of FIG. 1 when viewed from the above, and the semiconductor device according to this exemplary embodiment will be described in detail. It should be noted that the seventh-layer line provided as the upper-layer line, a ground side line, and an inter-block line are omitted in FIG. 3.

As shown in FIG. 3, the upper-layer line is continuously formed irrespective of the power control region and the constant power supply region. On the other hand, the first interlayer line is formed above the power control region, and the second interlayer line is formed above the constant power supply region. The first and second interlayer lines are separately provided. The first and second interlayer lines are formed by using two line layers. For example, when the fourth and fifth line layers are used for forming the first and second interlayer lines, the line formed in the fourth layer and the line formed in the fifth layer are formed so as to be perpendicular to each other, thereby forming the first and second interlayer lines in a mesh form. An interval between the lines provided in the mesh form is set to be larger than that between the first and second lower-layer lines. Further, the first and second interlayer lines formed in the fourth layer and the first and second interlayer lines formed in the fifth layer are respectively connected by the via line for connecting the fourth layer with the fifth layer. The first lower-layer line is formed above the power control region, and the second lower-layer line is formed above the constant power supply region. The first and second lower-layer lines are separately provided.

Here, in the semiconductor device according to this exemplary embodiment, the first interlayer line is connected with the upper-layer line through the switch cell SW. In contrast, the second interlayer line is connected by the via line for connecting the sixth layer and the fifth layer. It should be noted that the connections between the upper-layer line and the switch cell SW and between the first interlayer line and the switch cell SW are formed by the through-via line. The first interlayer line and the second interlayer line are connected by the via line for connecting the first layer and the fourth layer.

Further, a region where no switch cell is disposed in the power control region becomes a cell placement region. In the semiconductor device according to this exemplary embodiment, the switch cell SW is not necessarily provided for each first lower-layer line. In the example shown in FIG. 3, a region where the standard cell can be arranged is secured in portions above and below the switch cell SW. Accordingly, in the power control region of the semiconductor device according to this exemplary embodiment, it is possible to arrange the cell placement region so as to bridge a plurality of switch cells SW.

Figure 4:
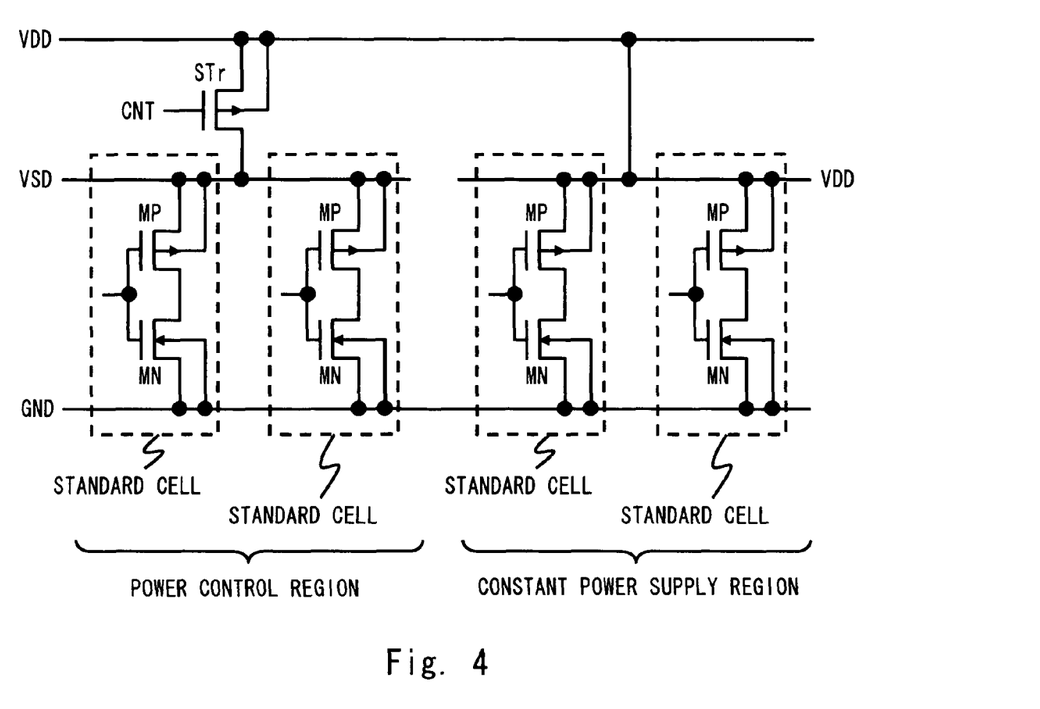
FIG. 4 is a circuit diagram showing an example of a circuit in the semiconductor device according to the first exemplary embodiment.

Here, FIG. 4 is a schematic diagram showing circuits in the power control region and the constant power supply region of the semiconductor device according to this exemplary embodiment. In FIG. 4, an inverter composed of a PMOS transistor MP and an NMOS transistor MN is shown as an example of one standard cell.

As shown in FIG. 4, in the power control region, the upper-layer line to which a power supply VDD is supplied from outside is connected with the first interlayer line through a switch transistor STr. In an example shown in FIG. 4, a power supply supplied through the switch transistor STr is represented as VSD, and the first interlayer line is denoted as "VSD" in the figure. The standard cells are connected between a ground side line to which a ground voltage GND is supplied and the first interlayer line. It should be noted that a control signal CNT is transmitted to a gate of the switch transistor STr from a control circuit (not shown), and the on/off state of switch transistor STr is subjected to is controlled based on the control signal CNT.

On the other hand, in the constant power supply region, the upper-layer line to which the power supply VDD is supplied from outside is connected with the second interlayer line through a line. In the example shown in FIG. 4, the power supply VDD supplied from outside is directly applied to the second interlayer line. Accordingly, the second interlayer line is denoted as "VDD" in the figure. The standard cells are connected between the ground side line to which the ground voltage GND is supplied and the second interlayer line.

In addition, the back gate of the PMOS transistor MP out of the transistors that constitute the standard cells in the power control region is connected to the first interlayer line. On the other hand, the switch transistor STr is required to operate when the standard cells in the power control region are in a stopped state. Therefore, the back gate of the switch transistor STr is connected to the upper-layer line. Further, the back gate of the PMOS transistor MP out of the transistors that constitute the standard cells in the constant power supply region is connected to the second interlayer line. It should be noted that the NMOS transistor MN of each of the standard cells in the power control region and the constant power supply region is connected to the ground side line.

Figure 5:
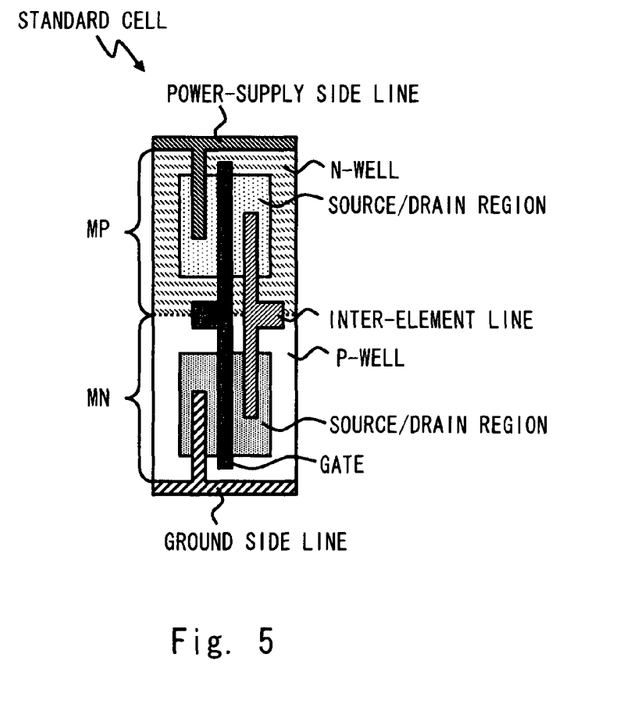
FIG. 5 is a diagram showing an example of a layout of a standard cell provided in the semiconductor device according to the first exemplary embodiment.

Subsequently, FIG. 5 shows an example of a layout of the standard cell shown in FIG. 4. The example of the layout shown in FIG. 5 indicates one standard cell. By arranging the standard cells, the semiconductor device implements various functions. As shown in FIG. 5, the standard cell has an N well in a region where the PMOS transistor MP is formed. On the N well, a P-type diffusion layer serving as a source/drain region of the PMOS transistor MP is provided, and the gate is provided at a predetermined position of the source/drain region. On the other hand, a region where the NMOS transistor MN is formed includes a P well that is formed by a semiconductor having the same conductivity type as a substrate region of the semiconductor device. On the P well, an N-type diffusion layer serving as a source/drain region of the NMOS transistor MN is provided, and the gate is provided at a predetermined position of the source/drain region. In a case where an inverter is formed as the one of standard cells, the gate of the PMOS transistor MP and the gate of the NMOS transistor MN can be formed as a continuous electrode.

Further, in the standard cell, a power-supply side line is provided at an end portion on the PMOS transistor MP side. The power-supply side line is connected to the diffusion layer on the source side of the PMOS transistor MP. In addition, in the standard cell, the ground side line is provided at an end portion on the NMOS transistor MN side. The ground side line is connected to the diffusion layer on the source side of the NMOS transistor MN. The diffusion layer on the drain side of the PMOS transistor MP is connected with the diffusion layer on the drain side of the NMOS transistor MN through an inter-element line. It should be noted that each of the power-supply side line, the ground side line, and the inter-element line provided in the standard cell corresponds to the first lower-layer line or the second lower-layer line.

Figure 6:
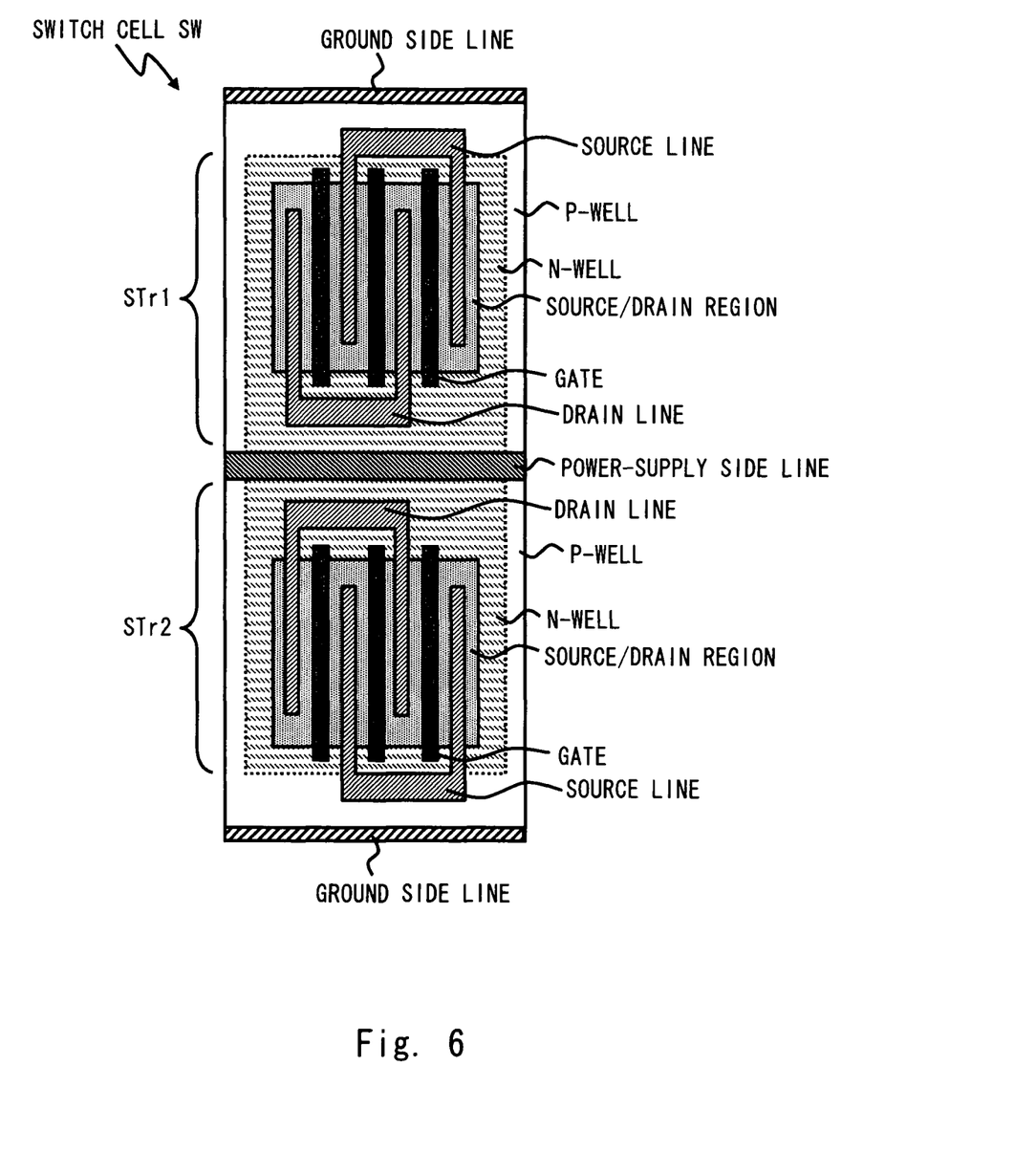
FIG. 6 is a diagram showing an example of a layout of a switch cell provided in the semiconductor device according to the first exemplary embodiment.

Next, FIG. 6 shows an example of a layout of the switch cell SW in which the switch transistor STr shown in FIG. 4 is provided. The example of the layout shown in FIG. 6 indicates that one switch cell SW is composed of two switch transistors. In this exemplary embodiment, to improve efficiency of the layout, the size of one switch cell SW is four times as large as the standard cell shown in FIG. 5. Also, the size of one switch transistor STr is six times as large as the transistor formed in the standard cell.

As shown in FIG. 6, in the switch cell SW, the power-supply side line is provided approximately at the center in the vertical direction. On both sides of the power-supply side line, switch transistors STr1 and STr2 are respectively provided. In this exemplary embodiment, the switch transistors STr1 and STr2 are each formed by the PMOS transistor. Therefore, the switch cell SW includes the N well in each of the regions where the switch transistors STr1 and STr2 are formed. On each of the N wells, the P-type diffusion layer serving as the source/drain region of the switch transistor is provided. The gate is provided at a predetermined position of the source/drain region. In the example shown in FIG. 6, switch transistors each having three gates are shown.

On each of the diffusion layers corresponding to the sources of the switch transistors STr1 and STr2, a source line connected to the upper-layer line is provided. In addition, on each of the diffusion layers corresponding to the drains of the switch transistors STr1 and STr2, a drain line connected to the first interlayer line is provided. In addition, on upper and lower end portions of the switch cell SW, the ground side lines are provided. The source lines, the drain lines, the power-supply side line, and the ground side lines of the switch cell SW correspond to the first lower-layer lines.

Figure 7:
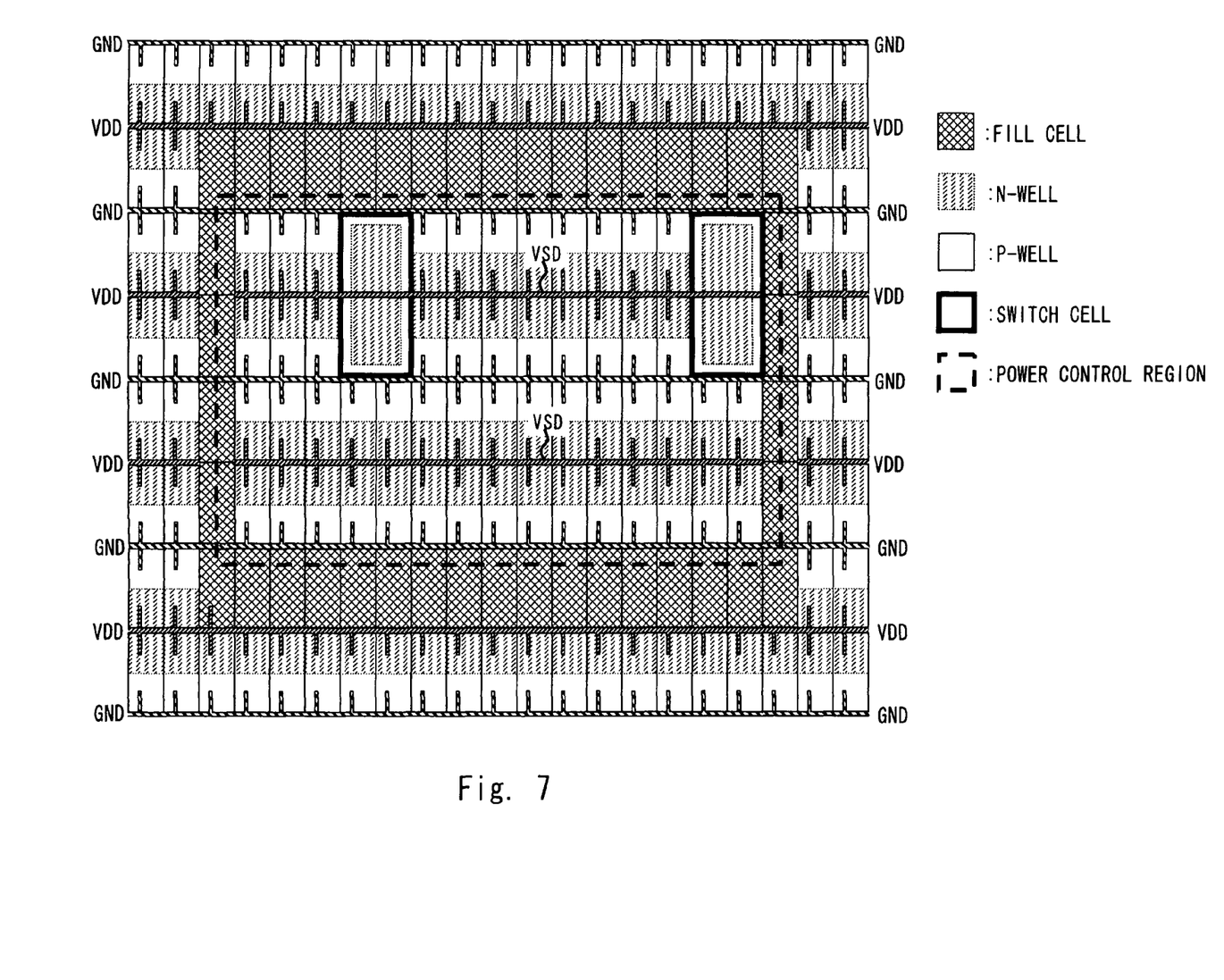
FIG. 7 is a diagram showing an example of a layout of the semiconductor device according to the first exemplary embodiment in which the standard cells and the switch cells are disposed.

The semiconductor device according to this exemplary embodiment is structured by using the standard cell shown in FIG. 5 and the switch cell SW shown in FIG. 6. When these cells are disposed, it is necessary to separate the well regions of the standard cell and the switch cell SW depending on whether the power supply is controlled or not. In a case where the well regions are not separated, even when power supply is shut off by the switch cell SW, a current might flow into the power control region through the well regions. In view of this, FIG. 7 shows an example of a layout in a case where the standard cells are arranged in the semiconductor device according to this exemplary embodiment. In the example shown in FIG. 7, to simplify the figure, only the well regions of the standard cells and the switch cells SW are shown. Also, regarding the lines, only the first and second lower-layer lines are shown. In the semiconductor device according to this exemplary embodiment, a fill cell in which a well can be formed only by a P well is used for isolating the well regions.

As shown in FIG. 7, the switch cells SW are provided in the power control region. Also in the power control region, the well regions of the switch cell SW and another standard cell are separated.

Further, in a case where the N wells are continuously formed in the lateral direction of the figure, the fill cells are provided between the standard cells in the constant power supply region laterally adjacent to the power control region and the standard cells in the power control region. When the switch cell SW is adjacent to the constant power supply region laterally adjacent to the power control region, the fill cell is provided between the switch cell SW and the constant power supply region.

In addition, in this exemplary embodiment, the fill cells are provided above and below the power control region in the figure. The fill cells are provided for meeting a spacing rule between the N well of the power control region and the N well of the constant power supply region. The spacing rule defines the minimum value of an interval between the regions in the layout of the semiconductor device for a stable operation of the semiconductor device and an improvement of a yield in the manufacturing process thereof. Accordingly, in a case where the spacing rule is met without providing any fill cell, the fill cells provided above and below the power control region can be eliminated.

In the semiconductor device, the power-supply side lines (lines indicated by VDD and lines indicated by VSD in FIG. 7) and the ground side lines (lines indicated by GND in FIG. 7) are alternately provided in the power control region or the constant power supply region. In the semiconductor device according to this exemplary embodiment, the ground side lines are continuously formed over the power control region and the constant power supply region. On the other hand, the power-supply side lines are divided between the power control region and the constant power supply region.

As described above, in the semiconductor device according to this exemplary embodiment, the switch cell SW is provided between the upper-layer line and the first interlayer line, and electric power is supplied to the first lower-layer line through the first interlayer line. Further, the first interlayer line and the first lower-layer line are connected by the via lines formed at arbitrary intervals. With this line structure, the current to be consumed in the standard cells connected to the first lower-layer line is supplied to the first interlayer line once, and then distributed to each standard cell through the via lines. Therefore, in the semiconductor device according to this exemplary embodiment, the arrangement interval of the switch transistors can be set according to an allowable current of the first interlayer line. In this case, the first interlayer line has the larger allowable current than the first lower-layer line. Accordingly, in the semiconductor device according to this exemplary embodiment, the arrangement interval between the switch cells can be increased. It should be noted that in the semiconductor device according to this exemplary embodiment, by setting the line interval of the first interlayer lines to be larger than that of the first lower-layer lines, the arrangement interval between the switch cells SW is increased.

Further, it is necessary to make the size of each of the switch transistors constituting the switch cell SW larger than each transistor constituting the standard cell in order to enable each switch transistor to feed a large amount of current. At this time, in a semiconductor device in the related art, the switch cell SW is provided for each first lower-layer line, which causes a problem in that a sufficient region to form a large switch transistor cannot be secured in the switch cell SW. In addition, in the semiconductor device in the related art, it is necessary to provide a number of element isolation regions for performing element isolation between the switch cells. However, in the semiconductor device according to this exemplary embodiment, it is possible to form a large switch transistor having a current capability equivalent to current capability of a multiple of switch transistors in a single switch cell. Therefore, in this exemplary embodiment, it is possible to reduce useless regions required for the element separation between the switch transistors. That is, in the semiconductor device according to this exemplary embodiment, the size of one switch transistor can be increased more efficiently than the semiconductor device in the related art.

Further, in the semiconductor device according to this exemplary embodiment, the first interlayer line and the first lower-layer line connected to a circuit that are a target to be subjected to power control by the switch cell and the second interlayer line and the second lower-layer line connected to a circuit that are not a target to be subjected to power control are formed so as to be electrically separated. With this structure, only the selected region in one semiconductor device can be the power control target. By partially performing the power control like this, a power consumption of the semiconductor device can be efficiently reduced. Further, in the semiconductor device according to this exemplary embodiment, the well regions are appropriately separated depending on whether the power supply state is controlled or not. Accordingly, it is possible to prevent a current from flowing into the well in a region where a circuit in a stopped state is formed through the well. In other words, the semiconductor device according to this exemplary embodiment can further reduce the power consumption as compared to the semiconductor device in the related art.

Second Exemplary Embodiment

Figure 8:
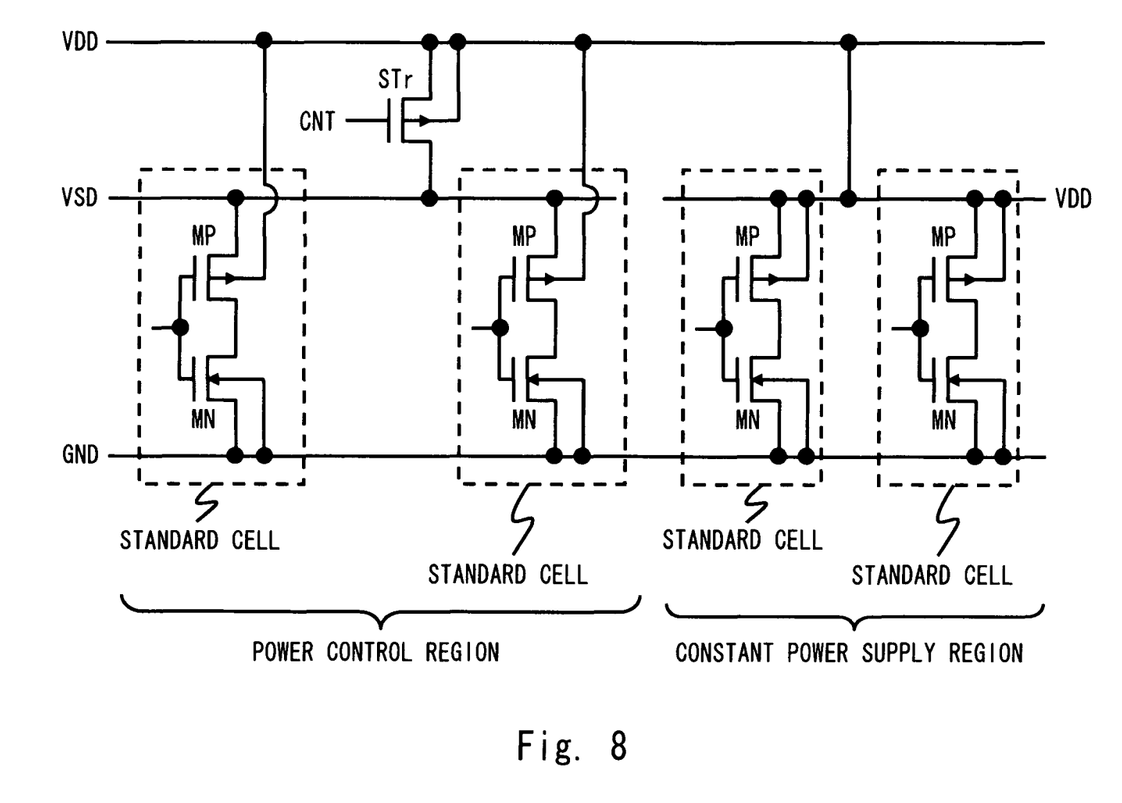
FIG. 8 is a circuit diagram showing an example of a circuit in a semiconductor device according to a second exemplary embodiment of the present invention.

A second exemplary embodiment shows a modified example in which the connection point to which the back gate of the PMOS transistor MP constituting the standard cell disposed in the power control region is connected is changed. FIG. 8 shows an example of a circuit diagram of a circuit in the second exemplary embodiment. The circuit shown in FIG. 8 has functions similar to those of the circuit shown in FIG. 4. As shown in FIG. 8, in the circuit of FIG. 8, the connection point to which the back gate of the PMOS transistor MP constituting the standard cell disposed in the power control region is connected is the upper-layer line VDD. That is, in the semiconductor device according to the second exemplary embodiment, the back gates of the switch transistor STr, the PMOS transistor disposed in the power control region, and the PMOS transistor disposed in the constant power supply region are connected to the same upper-layer line. On the other hand, also in the circuit shown in FIG. 8, the source of the PMOS transistor MP in the power control region is connected to the first interlayer line VSD.

Figure 9:
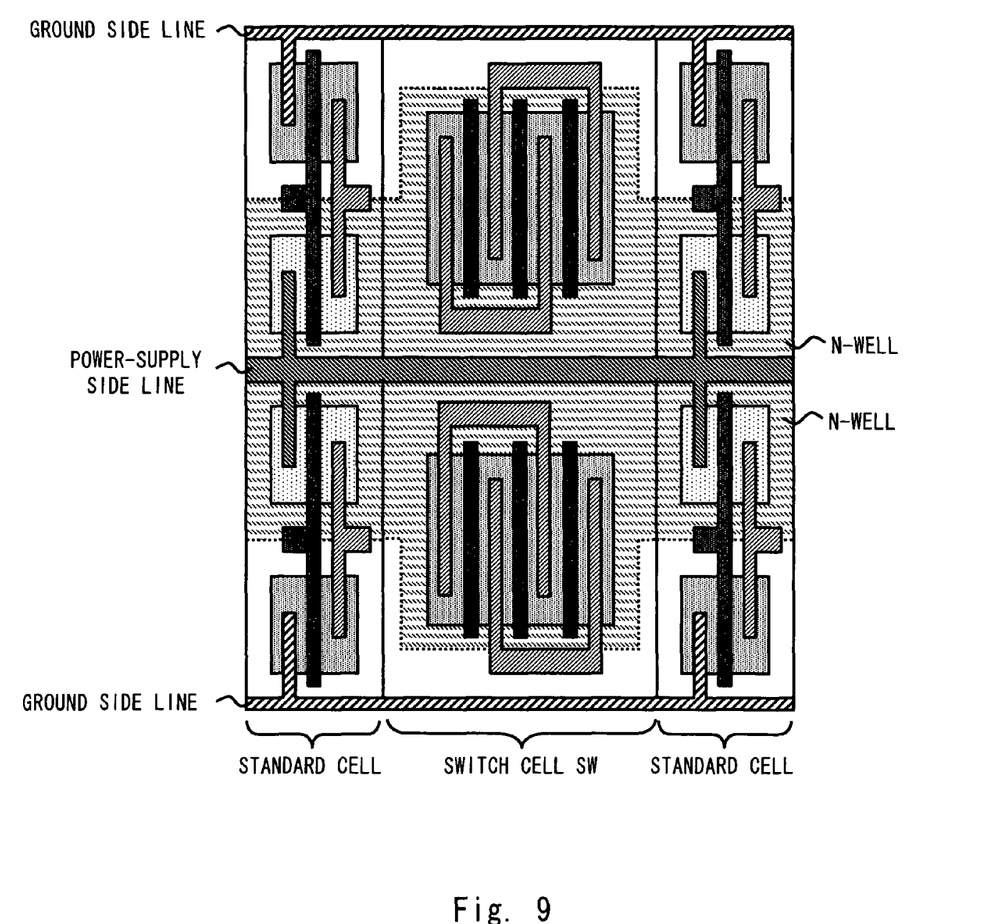
FIG. 9 is a diagram showing an example of a layout of a standard cell and a switch cell provided in the semiconductor device according to the second exemplary embodiment.

Here, a description will be given of a layout of the N wells of the standard cells in the power control region and the switch cells SW in the semiconductor device according to the second exemplary embodiment. In the second exemplary embodiment, the back gates of the switch transistor STr and the PMOS transistor disposed in the power control region are both connected to the upper-layer line. Therefore, the N well of the switch cell SW and the N well of the standard cell can be connected. FIG. 9 shows an example of the layout of the switch cells SW and the standard cells disposed around the switch cells SW.

As shown in FIG. 9, in the semiconductor device according to the second exemplary embodiment, the N well of the switch cell SW and the N well of the standard cell are continuously formed. It should be noted that the source/drain region, the gate, and the line of each transistor in the standard cell and the switch cell SW are the same as those shown in FIGS. 4 and 5, and therefore their descriptions are omitted herein.

Further, in the semiconductor device according to the second exemplary embodiment, the back gates of the switch transistor STr, the PMOS transistor disposed in the power control region, and the PMOS transistor disposed in the constant power supply region are each connected to the same upper-layer line. Accordingly, the standard cells can be disposed without providing the fill cell even in the layout of the entire semiconductor device. In this case, it is necessary to provide the first interlayer line and the first lower-layer line in the power control region independently from the line for the back gate of the PMOS. Further, it is necessary to separate the first interlayer line and the first lower-layer line from the second interlayer.

Figure 10:
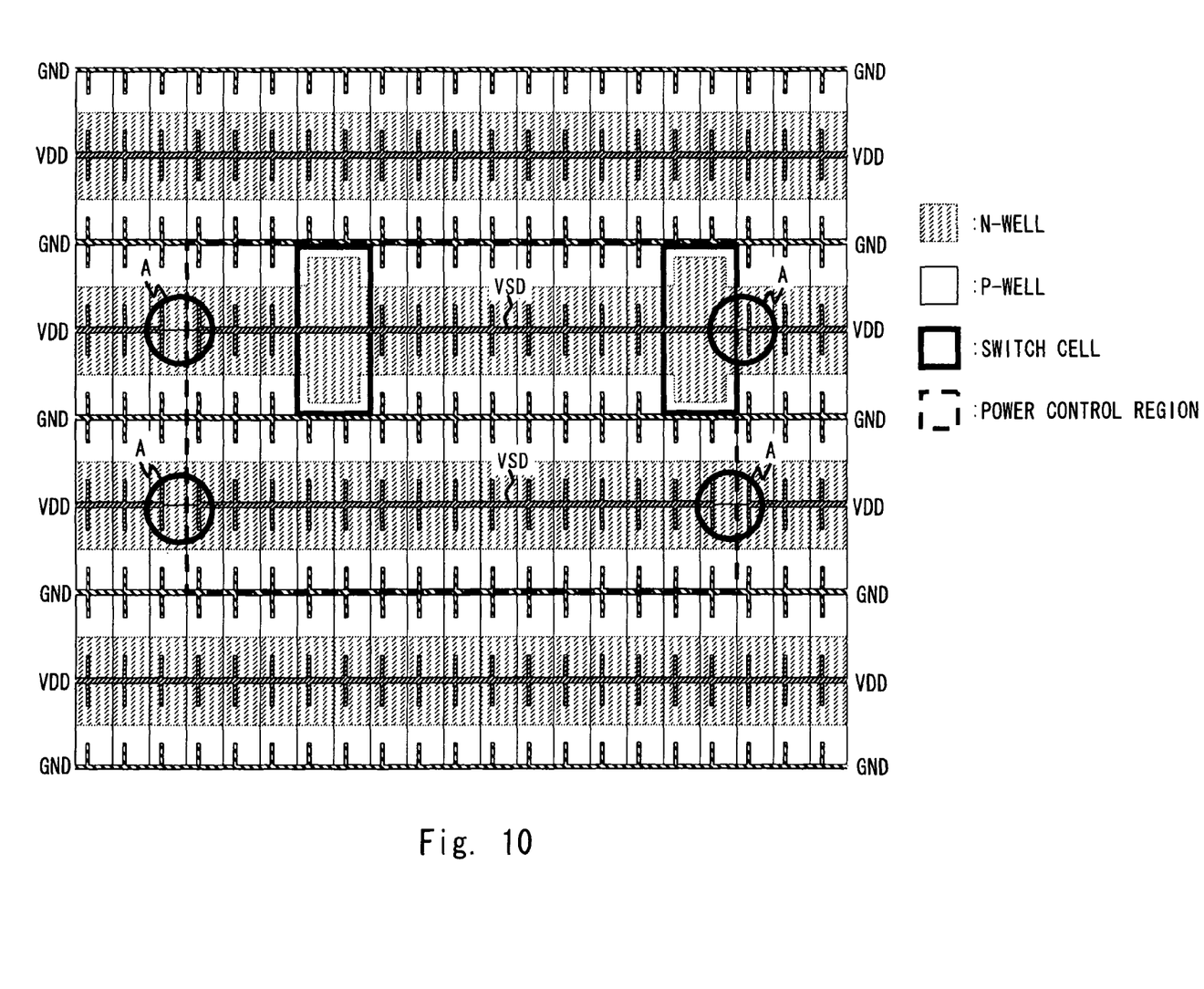
FIG. 10 is a diagram showing an example of a layout of the semiconductor device according to the second exemplary embodiment in which the standard cells and the switch cells are disposed.

Here, FIG. 10 shows a layout of the semiconductor device according to the second exemplary embodiment corresponding to the layout of the semiconductor device according to the first exemplary embodiment shown in FIG. 7. As shown in FIG. 10, in the semiconductor device according to the second exemplary embodiment, the standard cells are disposed without providing the fill cell. At this time, in a region indicated by A of FIG. 10, the line VSD serving as the power-supply side line out of the first lower-layer lines and the line VDD serving as the power-supply side line out of the second lower-layer lines are separated. On the other hand, the ground side line is formed over the power control region and the constant power supply region also in the second exemplary embodiment.

Furthermore, as shown in FIG. 10, in the second exemplary embodiment, the layout in which the N well of the power control region and the N well of the constant power supply region are continuously formed is adopted.

It should be noted that also in the semiconductor device according to the second exemplary embodiment, no problem arises when the fill cells are disposed for meeting the spacing rule.

As described above, in the semiconductor device according to the second exemplary embodiment, by connecting the back gate of the PMOS transistor in the power control region to the upper-layer line in the same way as the switch transistor STr, the N well of the switch cell SW and the N well of the standard cell can be formed as a continuous region. In addition, by connecting the back gate of the PMOS transistor in the power control region to the upper-layer line in the same way as the PMOS transistor MP in the constant power supply region, the N well of the standard cell in the power control region and the N well of the standard cell can be formed as a continuous region. In this way, by designing the layout without using the fill cell, the semiconductor device according to the second exemplary embodiment can further increase a layout efficiency as compared to the semiconductor device according to the first exemplary embodiment.

In addition, as in the semiconductor device according to the second exemplary embodiment, a back gate line and a source line (the first interlayer line and the first lower-layer line) of the PMOS transistor MP in the power control region are independently provided. With this structure, even when the switch transistor STr is in an off state, the N well of the power control region and the N well of the constant power supply region have the same potential, and therefore a current does not flow between the N wells of the two regions.

Further, a leak current of the transistor mainly flows between the source/drain regions of the transistor, and hardly flows into the back gate region. Therefore, also in the semiconductor device according to the second exemplary embodiment, the leak current of the transistor can be suppressed by the switch transistor STr. At this time, the leak current flowing into the back gate of the PMOS transistor in the power control region is negligibly small. Accordingly, an effect of suppressing the leak current in the semiconductor device according to the second exemplary embodiment is approximately the same as that of the semiconductor device according to the first exemplary embodiment.

It should be noted that the present invention is not limited to the above embodiments, and can be modified as appropriate without departing from the gist thereof. For example, the switch transistor can be implemented by an NMOS transistor.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device, comprising:
a semiconductor substrate;
a first lower-layer line for supplying power to a transistor formed on the semiconductor substrate;
a first interlayer line which is connected to the first lower-layer line, and has an allowable current of which is larger than that of the first lower-layer line; and
an upper-layer line which is provided above the first interlayer line and receives power input from an external source,
wherein the first interlayer line is connected to the upper-layer line through a switch circuit formed on the semiconductor substrate,
wherein a thickness of the first lower-layer line is less than a thickness of the first interlayer line.

2. The semiconductor device according to claim 1, wherein the first interlayer line includes a plurality of first interlayer lines and the first lower-layer line includes a plurality of first lower-layer lines, intervals between the plurality of first interlayer lines being larger than intervals between the plurality of first lower-layer lines.

3. The semiconductor device according to claim 1, wherein the first interlayer line is extended in a first direction, the upper-layer line is extended in a second direction perpendicular to the first direction, and the switch circuit is disposed in a vicinity of an intersection of the first interlayer line and the upper-layer line.

4. The semiconductor device according to claim 2, wherein the first interlayer line is extended in a first direction, the upper-layer line is extended in a second direction perpendicular to the first direction, and the switch circuit is disposed in a vicinity of an intersection of the first interlayer line and the upper-layer line.

5. The semiconductor device according to claim 1, wherein the semiconductor substrate includes:
a first region in which a first transistor, to which power is supplied through the switch circuit, is disposed; and
a second region in which a second transistor, to which power is supplied without involving the switch circuit, is disposed, and
wherein the first interlayer line supplies power to the first transistor.

6. The semiconductor device according to claim 2, wherein the semiconductor substrate includes:
a first region in which a first transistor, to which power is supplied through the switch circuit, is disposed; and
a second region in which a second transistor, to which power is supplied without involving the switch circuit, is disposed, and
wherein the first interlayer line supplies power to the first transistor.

7. The semiconductor device according to claim 3, wherein the semiconductor substrate includes:
a first region in which a first transistor, to which power is supplied through the switch circuit, is disposed; and
a second region in which a second transistor, to which power is supplied without involving the switch circuit, is disposed, and
wherein the first interlayer line supplies power to the first transistor.

8. The semiconductor device according to claim 4, wherein the semiconductor substrate includes:

a first region in which a first transistor, to which power is supplied through the switch circuit, is disposed; and a second region in which a second transistor, to which power is supplied without involving the switch circuit, is disposed, and wherein the first interlayer line supplies power to the first transistor.

9. The semiconductor device according to claim 5, further comprising:

a second lower-layer line that is provided on a same line layer as the first lower-layer line and provided separately from the first lower-layer line, wherein the second lower-layer line supplies power from the upper-layer line to the second transistor.

10. The semiconductor device according to claim 6, further comprising:

a second lower-layer line that is provided on a same line layer as the first lower-layer line and provided separately from the first lower-layer line, wherein the second lower-layer line supplies power from the upper-layer line to the second transistor.

11. The semiconductor device according to claim 7, further comprising:

a second lower-layer line that is provided on a same line layer as the first lower-layer line and provided separately from the first lower-layer line, wherein the second lower-layer line supplies power from the upper-layer line to the second transistor.

12. The semiconductor device according to claim 8, further comprising:

a second lower-layer line that is provided on a same line layer as the first lower-layer line and provided separately from the first lower-layer line, wherein the second lower-layer line supplies power from the upper-layer line to the second transistor.

13. The semiconductor device according to claim 9, further comprising:

a second interlayer line that is provided on a same line layer as the first interlayer line and provided separately from the first interlayer line, wherein the second interlayer line is connected to the upper-layer line and the second lower-layer line without involving the switch circuit.

14. The semiconductor device according to claim 10, further comprising:

a second interlayer line that is provided on a same line layer as the first interlayer line and provided separately from the first interlayer line, wherein the second interlayer line is connected to the upper-layer line and the second lower-layer line without involving the switch circuit.

15. The semiconductor device according to claim 11, further comprising:

a second interlayer line that is provided on a same line layer as the first interlayer line and provided separately from the first interlayer line, wherein the second interlayer line is connected to the upper-layer line and the second lower-layer line without involving the switch circuit.

16. The semiconductor device according to claim 12, further comprising:

a second interlayer line that is provided on a same line layer as the first interlayer line and provided separately from the first interlayer line, wherein the second interlayer line is connected to the upper-layer line and the second lower-layer line without involving the switch circuit.

17. The semiconductor device according to claim 1, wherein the transistor is one of a plurality of transistors.

18. The semiconductor device according to claim 17, further comprising a first cell and a second cell, wherein the first cell comprises one of the plurality of transistors and the second cell comprises another one of the plurality of transistors, and wherein the first cell is connected to the switch circuit and the second cell is connected to the upper-layer line.

19. The semiconductor device according to claim 1, wherein the amount of allowable current of the first lower-layer line is lower than an amount of allowable current of the upper-layer line.

20. The semiconductor device according to claim 1, wherein the switch circuit comprises a plurality of switch circuits having an arrangement interval that is set according to the allowable current of the first interlayer line.

* * * * *